(12) United States Patent
Hickman et al.

(10) Patent No.: US 11,661,335 B2
(45) Date of Patent: May 30, 2023

(54) METHOD AND SYSTEM FOR SCANNING MEMS CANTILEVERS

(71) Applicant: Magic Leap, Inc., Plantation, FL (US)

(72) Inventors: Steven Alexander-Boyd Hickman, Seattle, WA (US); Sarah Colline McQuaide, Seattle, WA (US); Abhijith Rajiv, Seattle, WA (US); Brian T. Schowengerdt, Seattle, WA (US); Charles David Melville, Camano Island, WA (US)

(73) Assignee: Magic Leap, Inc., Plantation, FL (US)

( * ) Notice: Subject to any disclaimer, the term of this patent is extended or adjusted under 35 U.S.C. 154(b) by 153 days.

(21) Appl. No.: 17/327,700

(22) Filed: May 22, 2021

(65) Prior Publication Data
US 2021/0363003 A1 Nov. 25, 2021

Related U.S. Application Data

(60) Provisional application No. 63/029,258, filed on May 22, 2020.

(51) Int. Cl.
*B81C 1/00* (2006.01)
*G02B 26/10* (2006.01)

(52) U.S. Cl.
CPC .... *B81C 1/0015* (2013.01); *B81C 2201/0132* (2013.01); *B81C 2201/0133* (2013.01); *G02B 26/103* (2013.01)

(58) Field of Classification Search
CPC .......... B81C 1/0015; B81C 2201/0132; B81C 2201/0133; G02B 26/103; B81B 2203/0118; B81B 2203/0384
See application file for complete search history.

(56) References Cited

U.S. PATENT DOCUMENTS

| | | | |
|---|---|---|---|
| 6,086,774 A * | 7/2000 | Ho | G01P 15/0802 216/2 |
| 2002/0018964 A1* | 2/2002 | Jerominek | G03F 7/2008 430/311 |
| 2004/0097004 A1 | 5/2004 | Pogge et al. | |
| 2006/0087064 A1* | 4/2006 | Daniel | F16H 1/125 267/102 |
| 2007/0284969 A1 | 12/2007 | Xu | |
| 2009/0146531 A1 | 6/2009 | Ruby et al. | |

(Continued)

OTHER PUBLICATIONS

Application No. PCT/US2021/033798, International Search Report and Written Opinion, dated Oct. 26, 2021, 13 pages.

(Continued)

*Primary Examiner* — Yasser A Abdelaziez
(74) *Attorney, Agent, or Firm* — Kilpatrick Townsend & Stockton LLP

(57) ABSTRACT

A method for fabricating a cantilever having a device surface, a tapered surface, and an end region includes providing a semiconductor substrate having a first side and a second side opposite to the first side and etching a predetermined portion of the second side to form a plurality of recesses in the second side. Each of the plurality of recesses comprises an etch termination surface. The method also includes anisotropically etching the etch termination surface to form the tapered surface of the cantilever and etching a predetermined portion of the device surface to release the end region of the cantilever.

20 Claims, 20 Drawing Sheets

(56) References Cited

U.S. PATENT DOCUMENTS

| | | | |
|---|---|---|---|
| 2009/0313730 A1 | 12/2009 | Hantschel et al. | |
| 2012/0060244 A1* | 3/2012 | Poddar | B82Y 35/00 |
| | | | 156/60 |
| 2017/0021391 A1 | 1/2017 | Guedes et al. | |
| 2017/0273867 A1* | 9/2017 | Allen | B65B 3/003 |

OTHER PUBLICATIONS

International Application No. PCT/US2021/033798, Invitation to Pay Additional Fees and, Where Applicable, Protest Fee mailed on Jul. 30, 2021, 2 pages.
Application No. PCT/US2021/033798, "International Preliminary Report on Patentability", dated Dec. 1, 2022, 10 pages.

* cited by examiner

METHOD AND SYSTEM FOR SCANNING MEMS CANTILEVERS

CROSS-REFERENCES TO RELATED APPLICATIONS

This application claims the benefit of priority to U.S. Provisional Patent Application No. 63/029,258, filed May 22, 2020, entitled "METHOD AND SYSTEM FOR SCANNING MEMS CANTILEVERS," the entire content of which is incorporated herein by reference for all purposes.

BACKGROUND OF THE INVENTION

Modern computing and display technologies have facilitated the development of systems for so called "virtual reality" or "augmented reality" experiences, wherein digitally reproduced images or portions thereof are presented to a viewer in a manner wherein they seem to be, or may be perceived as, real. A virtual reality, or "VR," scenario typically involves presentation of digital or virtual image information without transparency to other actual real-world visual input; an augmented reality, or "AR," scenario typically involves presentation of digital or virtual image information as an augmentation to visualization of the actual world around the viewer.

Despite the progress made in these display technologies, there is a need in the art for improved methods and systems related to augmented reality systems, particularly, display systems.

SUMMARY OF THE INVENTION

The present invention relates generally to methods and systems for fabrication of scanning micro-electro-mechanical-system (MEMS) cantilevers. More particularly, embodiments of the present invention provide a method and system for fabricating a scanning MEMS cantilever with a tapered profile. The invention is applicable to a variety of applications in computer vision and image display systems.

According to an embodiment of the present invention, a method for fabricating a cantilever is provided. The method includes providing a semiconductor substrate comprising a first semiconductor layer, a first dielectric layer coupled to the first semiconductor layer, and a second semiconductor layer coupled to the first dielectric layer, forming a second dielectric layer coupled to the first semiconductor layer, forming a third dielectric layer coupled to the second semiconductor layer, and forming a first hardmask layer coupled to the second dielectric layer. The first hardmask layer comprises a first set of openings exposing a first surface portion of the second dielectric layer. The method also includes etching the second dielectric layer using the first hardmask layer as a mask, etching the first semiconductor layer using the first hardmask layer as a mask, etching the first dielectric layer using the first hardmask layer as a mask. The method further includes etching the second semiconductor layer using the first hardmask layer as a mask to form a plurality of recesses each with a tapered surface. Each of the plurality of the recesses comprises a first depth at a first region and a second depth greater than the first depth at a second region. The first hardmask layer is then removed.

Additionally, the method includes forming a second hardmask layer coupled to the third dielectric layer. The second hardmask layer comprises a second set of openings exposing a second surface portion of the third dielectric layer and the second surface portion of the third dielectric layer is aligned with at least part of the second region of each of the plurality of recesses. The method also includes etching the third dielectric layer and the second semiconductor layer using the second hardmask layer as a mask to extend into the plurality of the recesses, removing the second hardmask layer, removing the third dielectric layer, and removing the second dielectric layer.

In some embodiments, the above method also includes forming a chrome layer coupled to the second semiconductor layer.

In some embodiments, forming the second dielectric layer includes using a low pressure chemical vapor deposition (LPCVD) process.

In some embodiments, etching the third dielectric layer includes using a reactive ion etching (RIE) process.

In some embodiments, etching the first semiconductor layer includes using a Deep RIE (DRIE) process.

In some embodiments, the first semiconductor layer is characterized by a (1 1 0) crystal orientation.

In some embodiments, the second semiconductor layer is characterized by a (1 1 1) crystal orientation.

In some embodiments, where the first semiconductor layer and the second semiconductor layer are characterized by different crystal orientations, they are formed separately and then joined together using a bonding process.

In some embodiments, etching the second semiconductor layer includes using a potassium hydroxide (KOH) process for a predetermined time period.

In some embodiments, the method also includes forming a protective dielectric layer coupled to the tapered surface of the plurality of recesses and to the second dielectric layer.

In some embodiments, forming the protective dielectric layer is performed after etching the second semiconductor layer.

According to another embodiment of the present invention, a method for fabricating a cantilever having a device surface, a tapered surface, and an end region is provided. The method includes providing a semiconductor substrate having a first side and a second side opposite to the first side and etching a predetermined portion of the second side to form a plurality of recesses in the second side. Each of the plurality of recesses comprises an etch termination surface. The method also includes anisotropically etching the etch termination surface to form the tapered surface of the cantilever and etching a predetermined portion of the device surface to release the end region of the cantilever.

In some embodiments, the method also includes anisotropically etching the tapered surface of the cantilever to form a first lateral tapered surface perpendicular to the first side of the semiconductor substrate, wherein the first lateral tapered surface tapers along the tapering direction of the tapered surface of the cantilever.

In some embodiments, the method also includes anisotropically etching the tapered surface of the cantilever to form a second lateral tapered surface perpendicular to the first side of the semiconductor substrate, wherein the second lateral tapered surface is formed opposite to the first lateral tapered surface, and wherein the second lateral tapered surface tapers along the tapering direction of the tapered surface of the cantilever.

In some embodiments, the tapering of the first lateral tapered surface is more rapid than the tapering of the second lateral tapered surface.

In some embodiments, the tapering of the first lateral tapered surface is slower than the tapering of the second lateral tapered surface.

In some embodiments, the tapering of the first lateral tapered surface is identical to the tapering of the second lateral tapered surface.

In some embodiments, the method also includes forming a chrome layer coupled to the first side of the semiconductor substrate.

In some embodiments, the method also includes forming a second dielectric layer coupled to the semiconductor substrate using a low pressure chemical vapor deposition (LPCVD) process.

In some embodiments, etching the predetermined portion of the second side includes using an RIE process.

In some embodiments, anisotropically etching the etch termination surface includes using a potassium hydroxide (KOH), ethylene diamine and pyrocatechol (EDP), or tetramethylammonium hydroxide (TMAH) process.

In some embodiments, the semiconductor substrate includes a first semiconductor layer characterized by a (1 1 0) crystal orientation and a second semiconductor layer characterized by a (1 1 1) crystal orientation.

In some embodiments, etching the predetermined portion of the device surface includes using an RIE process.

According to a specific embodiment of the present invention, a method for fabricating a semiconductor cantilever is provided. The method includes providing a semiconductor substrate. The semiconductor substrate comprises a first semiconductor layer, a first dielectric layer coupled to the first semiconductor layer, a second semiconductor layer coupled to the first dielectric layer, a second dielectric layer coupled to the second semiconductor layer, and a third dielectric layer coupled to the second dielectric layer. The method also includes forming a fourth dielectric layer coupled to the first semiconductor layer, forming a fifth dielectric layer coupled to the third dielectric layer, and forming a first hardmask layer coupled to the fourth dielectric layer. The first hardmask layer comprises a first set of openings exposing a first surface portion of the fourth dielectric layer.

The method further includes etching the fourth dielectric layer using the first hardmask layer as a mask, etching the first semiconductor layer using the first hardmask layer as a mask, etching the first dielectric layer using the first hardmask layer as a mask. The method also includes etching the second semiconductor layer using the first hardmask layer as a mask to form a plurality of recesses each with a tapered surface. Each of the plurality of recesses comprises a first depth at a first region and a second depth greater than the first depth at a second region. The method includes removing the first hardmask layer. Additionally, the method includes forming a second hardmask layer coupled to the fifth dielectric layer. The second hardmask layer comprises a second set of openings exposing a second surface portion of the fifth dielectric layer and the second surface portion of the fifth dielectric layer is aligned with at least part of the second region of the tapered surface. Moreover, the method includes etching the fifth dielectric layer, the third dielectric layer and the second semiconductor layer using the second hardmask layer as a mask to extend into the plurality of recesses, removing the second hardmask layer, removing the fifth dielectric layer, and removing the fourth dielectric layer.

In some embodiments, the method also includes forming a chrome layer coupled to the third dielectric layer.

In some embodiments, forming the fourth dielectric layer includes using an LPCVD process.

In some embodiments, etching the fourth dielectric layer includes using an RIE process.

In some embodiments, etching the first semiconductor layer includes using a DRIE process.

In some embodiments, the semiconductor substrate includes a first semiconductor layer characterized by a (1 1 0) crystal orientation and a second semiconductor layer characterized by a (1 1 1) crystal orientation.

In some embodiments, etching the second semiconductor layer comprises using a KOH process for a predetermined time period.

In some embodiments, the method also includes forming a protective dielectric layer coupled to the tapered surface and to the fourth dielectric layer.

In some embodiments, forming the protective dielectric layer is performed after etching the semiconductor layer.

Numerous benefits are achieved by way of the present invention over conventional techniques. For example, embodiments of the present invention provide methods and systems that can be used to fabricate a cantilever that can be integrated into fiber scanning display systems. The methods implemented by embodiments of the prevent invention may provide a cantilever with uniform quality. The cantilever fabricated with embodiments of the present invention may include a tapered profile that can be finely tuned. The size of the tapered tip of the cantilever may be finely controlled during the fabrication process to accommodate different fiber scanning display systems.

These and other embodiments of the invention along with many of its advantages and features are described in more detail in conjunction with the text below and attached figures.

DETAILED DESCRIPTION OF THE INVENTION

Embodiments of the present invention relate to methods and system for fabricating a cantilever for a fiber scanning display system. In some fiber scanning display systems, the scanning tip of the scanning element has a significantly reduced cross-section compared to the normal cross-section of the fiber optics. A cantilever with a tapered scanning tip can be used as the scanning element in the fiber scanning display system. Embodiments of the present invention provide such a cantilever fabricated on semiconductor substrates.

Figure 1:
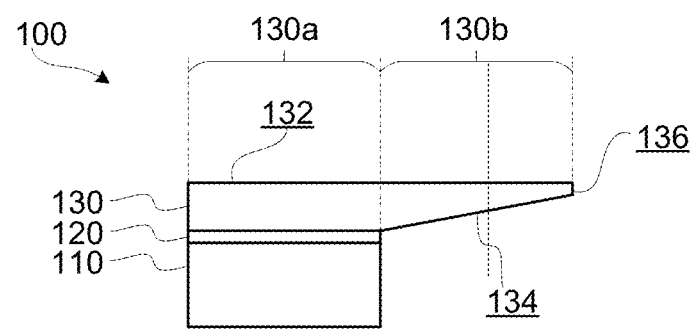
FIG. 1 is a simplified side view illustrating a cantilever according to an embodiment of the present invention.

FIG. 1 is a simplified side view illustrating a cantilever 100 according to an embodiment of the present invention. Referring to FIG. 1, cantilever 100 may include first semiconductor layer 110, first dielectric layer 120 coupled to first semiconductor layer 110, and second semiconductor layer 130 coupled to first dielectric layer 120. In one embodiment, cantilever 100 may be made using silicon-on-insulator (SOI) wafer. In this case, first semiconductor layer 110 may include silicon, and can have a thickness of about 300 µm. First dielectric layer 120 may be a buried oxide (BOX) layer including $SiO_2$, and can have a thickness of about 1 µm. Second semiconductor layer 130 may be a device layer including silicon and have a thickness of about 115 µm. Second semiconductor layer 130 may include a device surface 132, in which MEMS devices can be fabricated or to which MEMS devices can be attached, and tapered surface 134 opposite device surface 132. Second semiconductor layer 130 is substantially divided into base portion 130a that is aligned with first semiconductor layer 110 and first dielectric layer 120, and cantilever portion 130b that protrudes from first semiconductor layer 110. Cantilever portion 130b may include tapered surface 134 and end tip 136.

Figure 2A:
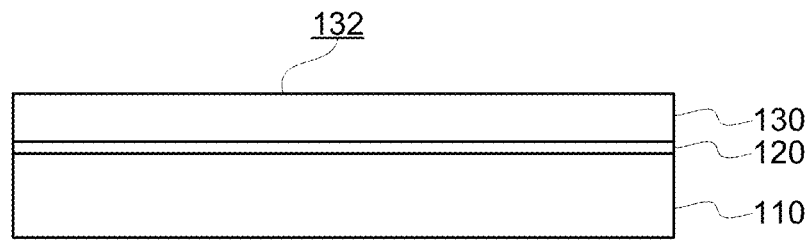
FIGS. 2A through 2K are partial cross-section views illustrating the intermediate stages of a method of fabricating a cantilever according to an embodiment of the present invention.

Referring to FIGS. 2A through 2L, a method of fabricating cantilever 200 is described according to an embodiment of the present invention. FIG. 2A is a partial cross-sectional view illustrating a semiconductor substrate (e.g., a SOI wafer) comprising first semiconductor layer 110, first dielectric layer 120 coupled to the first semiconductor layer 110, and second semiconductor layer 130 coupled to the first dielectric layer 120. For clarity of description, the side where second semiconductor layer 130 is disposed is designated as the first side of the semiconductor substrate, and the side where first semiconductor layer 110 is disposed is designated as the second side of the semiconductor substrate. In one embodiment, first semiconductor layer 110 comprises silicon having a thickness of about 300 µm. First dielectric layer 120 may be a buried oxide (BOX) layer, such as $SiO_2$ layer, having a thickness of about 1 µm. Second semiconductor layer 130 may comprises single crystal silicon having a thickness of about 115 µm. It should be noted the thicknesses of first semiconductor layer 110, first dielectric layer 120, and second semiconductor layer 130 may vary as appropriate to the particular application. In one embodiment, first semiconductor layer 110 is characterized by a (1 0 0) or (1 1 0) crystal orientation, and second semiconductor layer 130 is characterized by a (1 1 1) crystal orientation. In some embodiments, where the first semiconductor layer 110 and the second semiconductor layer 130 have different crystal orientations, they may be formed separately and then joined together using a bonding process. Second semiconductor layer 130 comprises device surface 132, in which MEMS devices may be fabricated or to which MEMS devices may be attached. As an example, a metal layer (e.g., chrome) can be deposited on device surface 132. Then a lift-off process may be performed to pattern the metal layer.

Figure 2B:
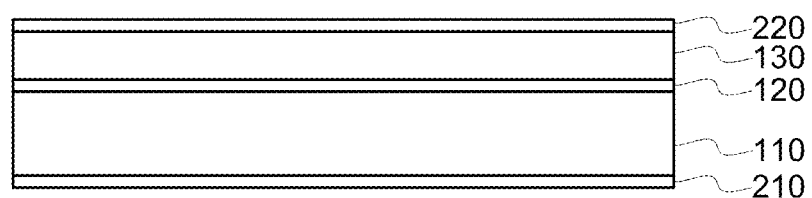

Referring to FIG. 2B, second dielectric layer 210 is formed on first semiconductor layer 110, and third dielectric layer 220 is formed on second semiconductor layer 130. In one embodiment, second dielectric layer 210 and third dielectric layer 220 may comprise silicon nitride ($Si_3N_4$) having a thickness in a range of about 0.5-2 µm. In one embodiment, second dielectric layer 210 and third dielectric layer 220 may be formed using a low pressure chemical vapor deposition (LPCVD) process. In some embodiments of the present invention, as described more fully below, a cantilever may be formed in which device surface 132 serves as a device surface of the cantilever. Thus, third dielectric layer 220 may protect device surface 132 from subsequent etching processes. In some embodiments, second dielectric layer 210 and/or third dielectric layer 220 may be not utilized as appropriate to the particular application.

Figure 2C:
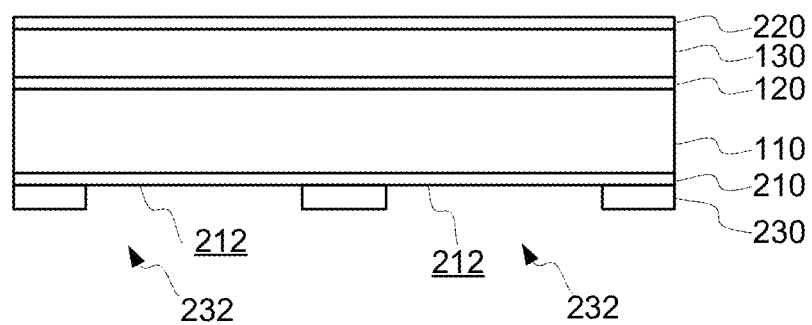

Referring to FIG. 2C, first hardmask layer 230 is formed on second dielectric layer 210. First hardmask layer 230 is patterned with first set of openings 232 through which first surface portion 212 of second dielectric layer 210 is exposed.

Figure 2D:
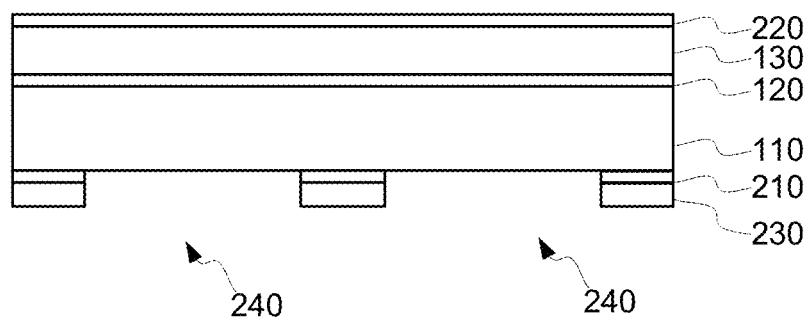
Figure 2E:
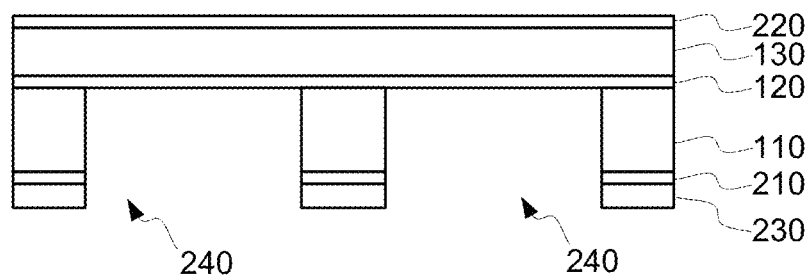
Figure 2F:
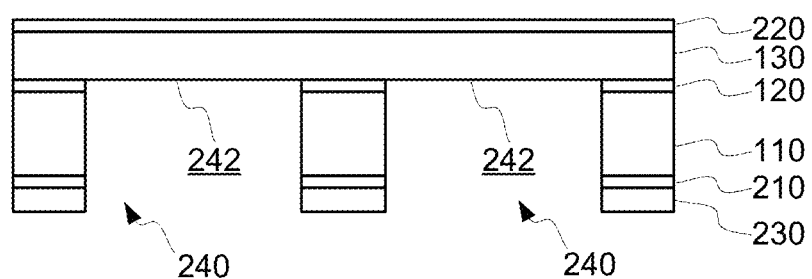

FIGS. 2D through 2F show the intermediate stages of etching a predetermined portion of the second side of the semiconductor substrate to form a plurality of recesses in the second side, wherein each of the plurality of recesses comprises an etch termination surface. Referring to FIG. 2D, an etching process is performed on second dielectric layer 210 using first hardmask layer 230 as a mask to form a plurality of recesses 240. In one embodiment, the etching process may include an RIE process.

Referring to FIG. 2E, an etching process is performed on first hardmask layer 230 using first hardmask layer 230 as a mask. In one embodiment, the etching process may include a DRIE process that extends recesses 240 through first semiconductor layer 110.

Referring to FIG. 2F, an etching process is performed on first dielectric layer 120 using first hardmask layer 230 as a mask. In one embodiment, the etching process may include an RIE process that forms recesses 240 passing through first dielectric layer 120 and form etch termination surface 242. Thereafter, first hardmask layer 230 is removed.

Figure 2G:
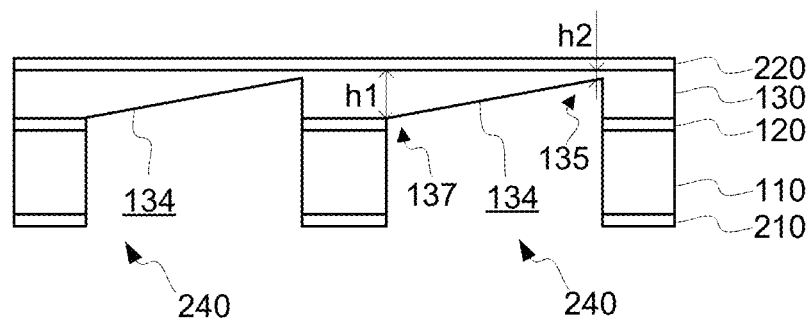

Referring to FIG. 2G, an etching process is performed on etch termination surface 242 (shown in FIG. 2F) of each of recesses 240 to form tapered surface 134 within second semiconductor layer 130. In one embodiment, first semiconductor layer 110 is characterized by a (1 1 0) crystal orientation and second semiconductor layer 130 is characterized by a (1 1 1) crystal orientation. The etching process may include a KOH-based etch process. In another embodiment, the etching process may include an EDP process or a TMAH process. In one embodiment, the etching process is performed for a predetermined time period, such as 30 minutes. It should be noted that the time period may vary as appropriate to the particular application according to the thickness of second semiconductor layer 130 and the particular etching process adopted. In each of recesses 240, tapered surface 134 progresses from base region 137 where the thickness h1 of second semiconductor layer 130 remains substantially unchanged to end region 135 where the thickness h2 of second semiconductor layer 130 substantially reduced to a predetermined thickness, such as 10 µm.

Figure 2H:
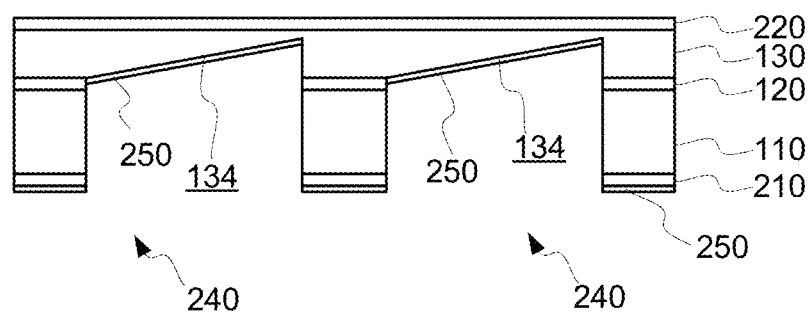
Figure 2I:
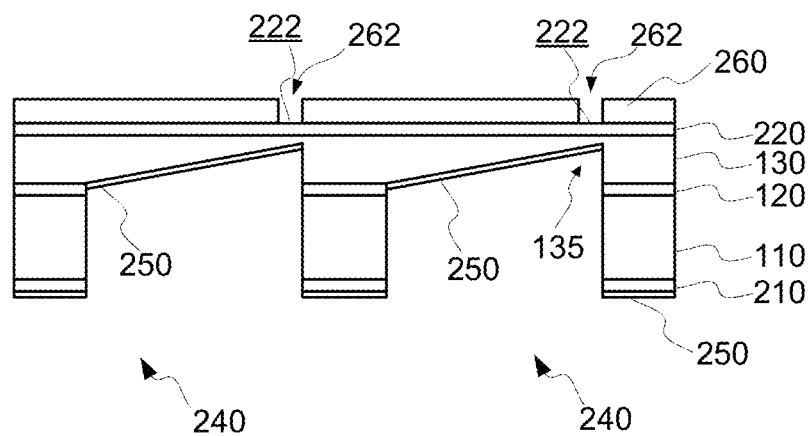
Figure 2J:
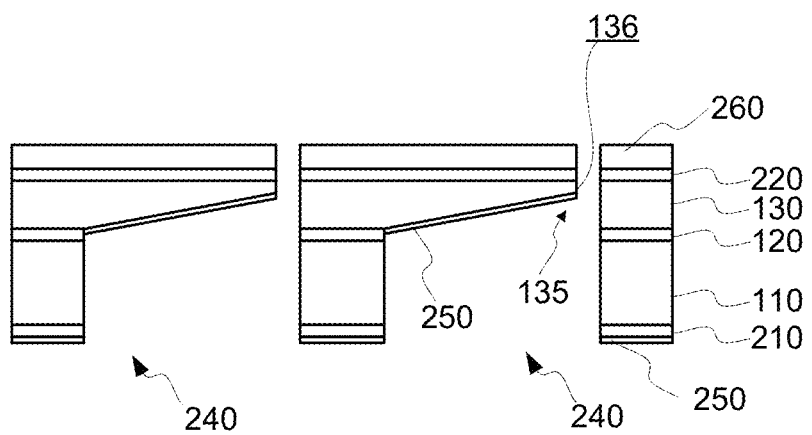

Referring to FIG. 2H, protective dielectric layer 250 is formed on tapered surface 134 and second dielectric layer 210. In one embodiment, protective dielectric layer 250 may include $SiO_2$ or photoresist layer having a thickness in a range of about 0.5-2 µm. In some embodiments of the present invention, protective dielectric layer 250 may protect tapered surface 134 from subsequent etching processes. In some other embodiments, the method may omit the process of forming protective dielectric layer 250 depending on the particular application. FIGS. 2I through 2J show the intermediate stages of etching a predetermined portion of the device surface of the semiconductor substrate to release end region 135 of the cantilever. Referring to FIG. 2I, second hardmask layer 260 is formed on third dielectric layer 220. In one embodiment, second hardmask layer 260 is patterned to define second set of openings 262 through which second surface portion 222 of third dielectric layer 220 is exposed. In one embodiment, second surface portion 222 is aligned with at least part of end region 135 of tapered surface 134 so as to enable the etching process (as defined by second set of openings 262) to separate end region 135 of the cantilever from the rest of second semiconductor layer 130. In one embodiment, the size of second set of openings 262 is determined to make the thickness h2 at end region 135 after separation to be a predetermined value, such as 10 µm.

Referring to FIG. 2J, an etching process is performed on third dielectric layer 220 using second hardmask layer 260 as a mask. In one embodiment, the etching process may include an RIE process. Then, an additional etching process is performed on second semiconductor layer 130 using second hardmask layer 260 as a mask. In one embodiment, the additional etching process may include a buffered oxide etching (BOE) process. After the additional etching process, end tip 136 is formed at end region 135. In one embodiment, the thickness of end tip 136 may be 10 µm.

Figure 2K:
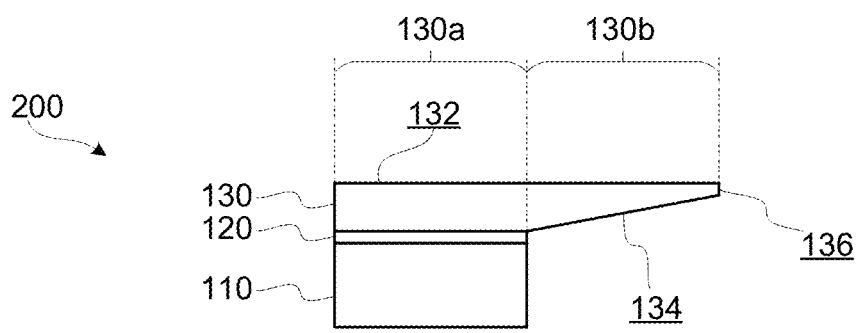

Referring to FIG. 2K, second hardmask layer 260, third dielectric layer 220, protective dielectric layer 250, and second dielectric layer 210 are removed. As shown in FIG. 2K, cantilever 200 is divided into base portion 130a aligned with first dielectric layer 120 and first semiconductor layer 110, and cantilever portion 130b with tapered surface 134 and end tip 136.

Figure 2L:
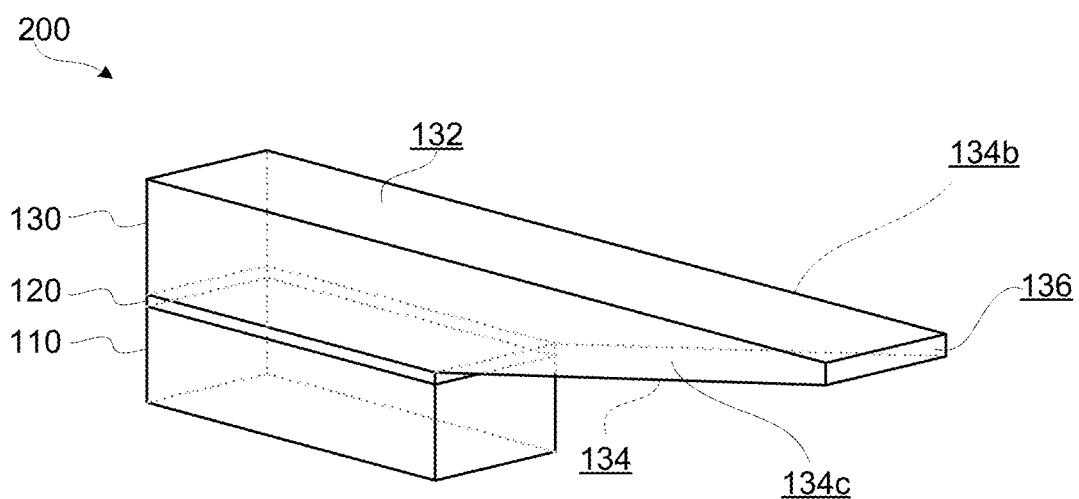
FIG. 2L is a perspective view illustrating a cantilever according to an embodiment of the present invention.

FIG. 2L is a perspective view illustrating cantilever 200 according to an embodiment of the present invention. Referring to FIG. 2L, cantilever 200 may include first semiconductor layer 110, first dielectric layer 120, and second semiconductor layer 130 comprising device surface 132, tapered surface 134, and an end tip 136. In addition, second semiconductor layer 130 may further include lateral surfaces 134b and 134c that are parallel with each other as described in reference to FIG. 2L.

Figure 2M:
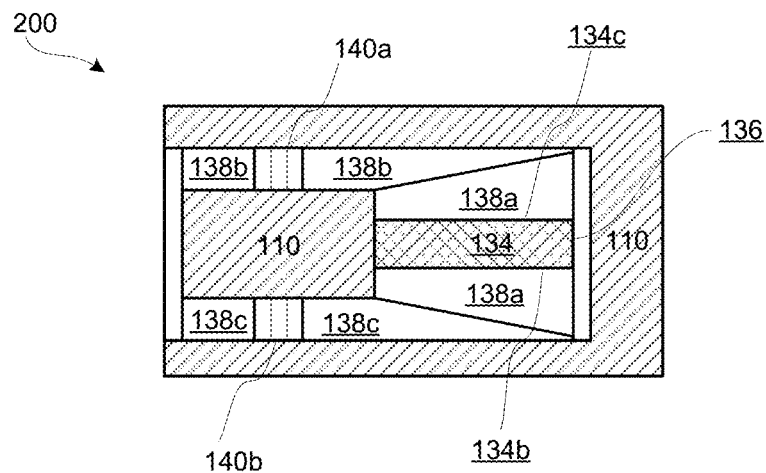
FIG. 2M is a partial bottom view of the cantilever as shown in FIG. 2K.

FIG. 2M is a partial bottom view of cantilever 200 as shown in FIG. 2K. Referring to FIG. 2M, tapered structures defined by tapered surfaces 138a, 138b, and 138c are formed within second semiconductor layer 130 as the result of the KOH etching process described with reference to FIG. 2G. The hatched rectangle labeled by tapered surface 134 denotes the length and width of cantilever portion 130b as shown in FIG. 2K. In one embodiment, additional anisotropic etching processes, such as a DRIE process, may be performed to remove portions of second semiconductor layer 130 denoted by tapered surface 138a, 138b, and 138c and to form lateral surfaces 134b and 134c perpendicular to the first side of the semiconductor substrate. In one embodiment, lateral surfaces 134b and 134c are parallel with each other. In one embodiment, passages 140a and 140b may be formed using an etching process, such as a DRIE process to provide pathways between first semiconductor layer 110 and second semiconductor layer 130.

Figure 2N:
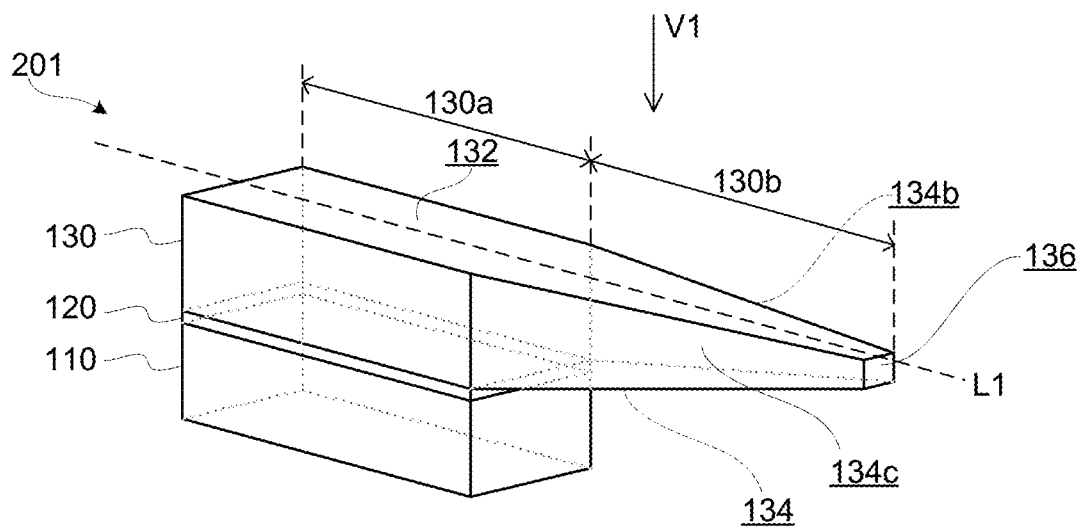
FIG. 2N is a perspective view illustrating another cantilever according to an embodiment of the present invention.

FIG. 2N is a perspective view illustrating another cantilever 201 according to an embodiment of the present invention. The difference of cantilever 201 shown in FIG. 2N from that shown in FIG. 2L lies in the triple tapered surfaces provided for the cantilever portion 130b (shown in FIG. 2K). Referring to FIG. 2N, cantilever 201 includes first semiconductor layer 110, first dielectric layer 120, and second semiconductor layer 130 comprising device surface 132, end tip 136, tapered surface 134, and lateral tapered surfaces 134b and 134c. Cantilever 201 with triple tapered surfaces 134, 134b, and 134c may provide the flexibility to adjust the size of end tip 136. As discussed below, the positioning of end tip 136 about longitudinal axis L1 can be adjusted by controlling the tapering of lateral tapered surface 134b and 134c.

Figure 2O:
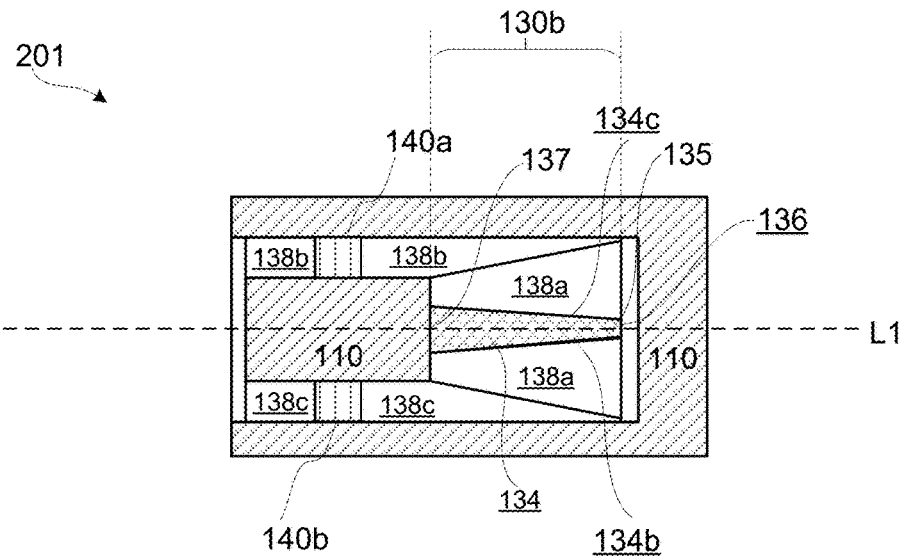
FIG. 2O is a partial bottom view illustrating a cantilever according to another embodiment of the present invention.

FIG. 2O is a partial bottom view illustrating cantilever 201 according to another embodiment of the present invention. Referring to FIG. 2O, when etching portions of second semiconductor layer 130 denoted by tapered surface 138a to form lateral surfaces 134b and 134c, the width of cantilever portion 130b is tapered from base region 137 to end region 135 to form two lateral tapered surfaces 134b and 134c. In one embodiment, the tapering of tapered surface 134b and 134c is symmetrical about a longitude axis L1 of cantilever 201. In another embodiment, the tapering of tapered surfaces 134b and 134c may be asymmetrical about the longitude axis L1. For example, the tapering of tapered surface 134b may be more rapid than that of tapered surface 134c. In another embodiment, the tapering of tapered surface 134b may be slower than that of tapered surface 134c. The tapering of the tapered surfaces 134b and/or 134c may vary as appropriate to the particular application.

Figure 2P:
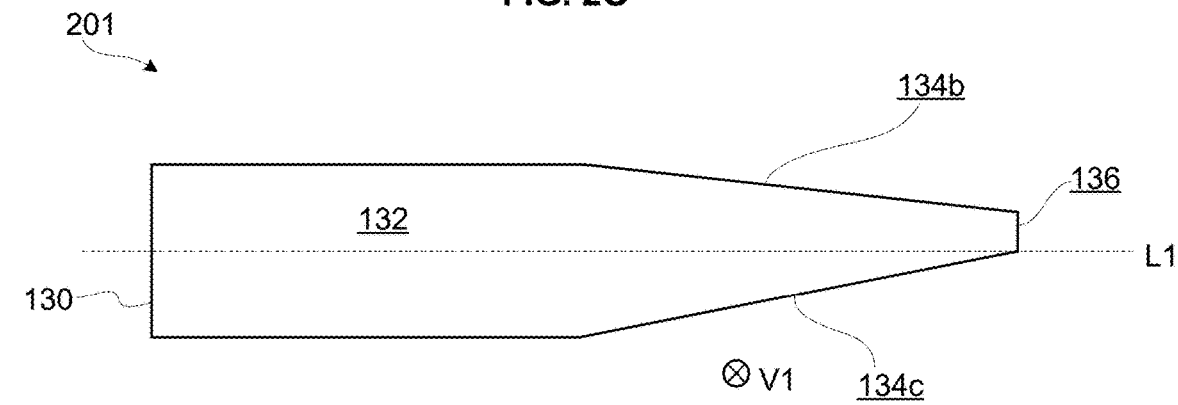
FIGS. 2P and 2Q are simplified top views illustrating a cantilever according to an embodiment of the present invention.
Figure 2Q:
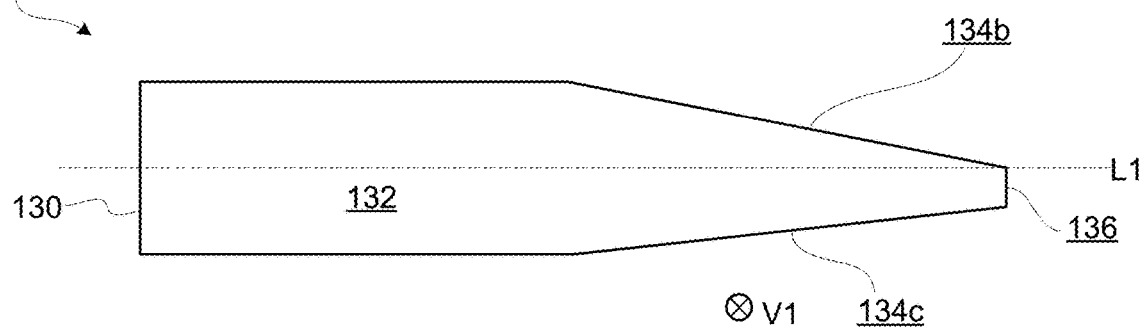

FIGS. 2P and 2Q are simplified top views illustrating cantilever 201 according to an embodiment of the present invention. Referring to FIG. 2P, the tapering of lateral tapered surface 134c is more rapid than that of lateral tapered surface 134b. As a result, end tip 136 is positioned in a manner such that the center of the end tip is disposed to the left of longitudinal axis L1. Thus, when viewing end tip 136 along a direction V1 normal to device surface 132 and perpendicular to longitudinal axis L1 as shown in FIG. 2N, end tip 136 is offset to the left of longitudinal axis L1 in FIG. 2N. Referring to FIG. 2Q, the tapering of lateral tapered surface 134c is slower than that of lateral tapered surface 134b. As a result, end tip 136 is offset to the right. Thus, when viewing end tip 136 along a direction V1 normal to device surface 132 and perpendicular to longitudinal axis L1 as shown in FIG. 2N, end tip 136 is offset to the right of longitudinal axis L1 in FIG. 2N.

Numerous benefits may be provided by the flexibility of adjusting end tip 136 by controlling the triple tapered surfaces 134, 134b, and 134c, alone or in combination. For example, cantilever 201 with a differently configured end tip 136 may be used to accommodate different optical structures of scanning fiber display devices.

Figure 3:
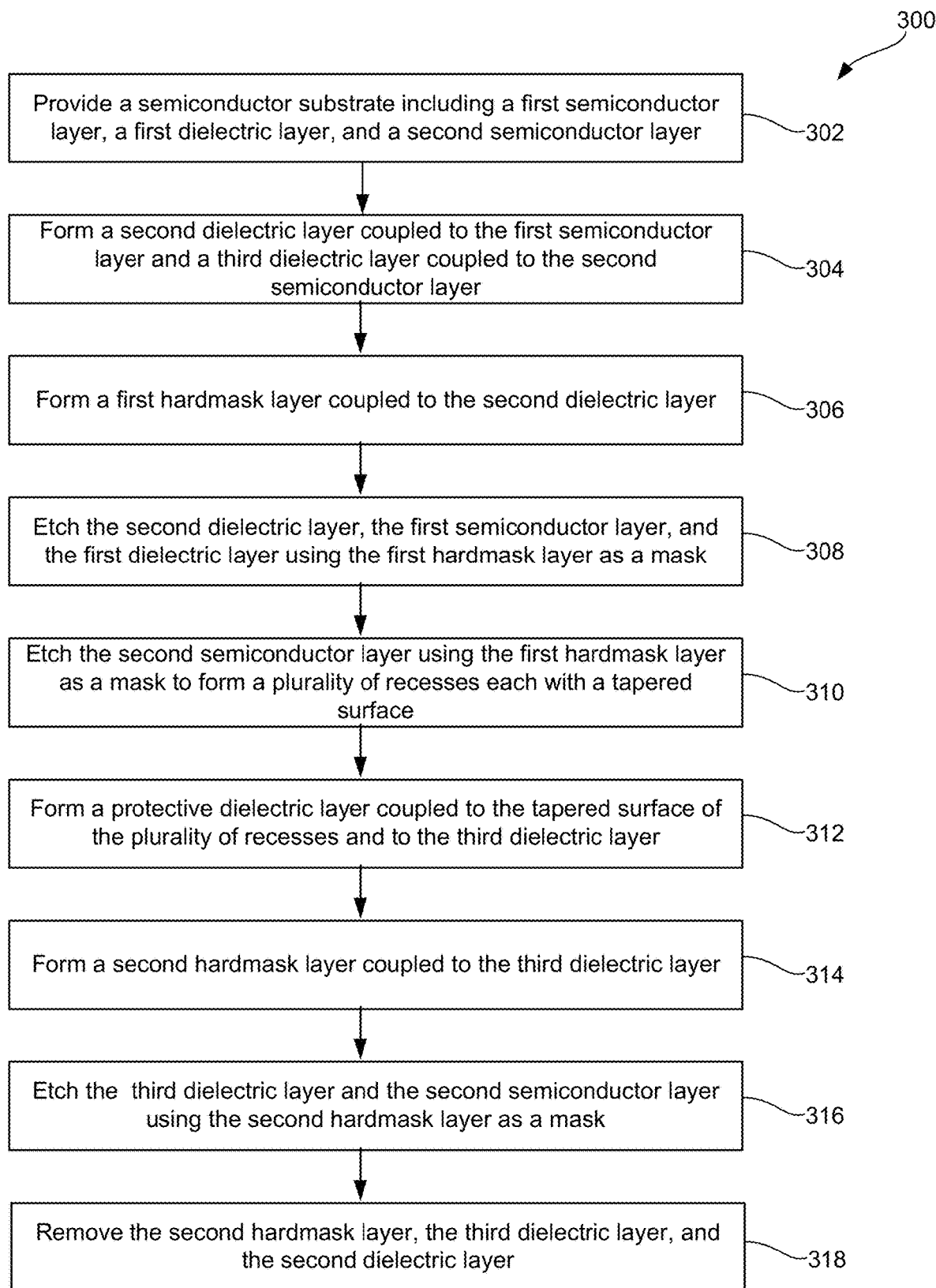
FIG. 3 is a simplified flowchart illustrating a method of fabricating a cantilever according to an embodiment of the present invention.

FIG. 3 is a simplified flowchart illustrating method 300 of fabricating a cantilever according to an embodiment of the present invention. Referring to FIG. 3, method 300 includes providing a semiconductor substrate including a first semiconductor layer, a first dielectric layer, and a second semiconductor layer (302). In the illustrated embodiment, the semiconductor substrate may include an SOI substrate, comprising a first semiconductor layer (e.g., Si), a first dielectric layer (e.g., SiO$_2$) coupled to the first semiconductor layer, and a second semiconductor layer (e.g., Si) coupled to the first dielectric layer. In one embodiment, the first semiconductor layer may include a Si layer having a thickness of about 300 μm, the first dielectric layer may include a SiO$_2$ layer having a thickness of about 1 μm, and the second semiconductor layer may include a Si layer having a thickness of about 115 μm.

The method 300 may further include forming a second dielectric layer coupled to the first semiconductor layer and forming a third dielectric layer coupled to the second semiconductor layer (302). In one embodiment, the second dielectric layer and the third dielectric layer may include silicon nitride (Si$_3$N$_4$) to protect the upper surface and the lower surface of the semiconductor substrate during a subsequent etching process. In some embodiments, method 300 can omit the process of forming the second dielectric layer.

Method 300 may further include forming a first hardmask layer coupled to the second dielectric layer (306). The first hardmask layer can include a first set of openings exposing a first surface portion of the second dielectric layer.

Method 300 further includes etching the second dielectric layer, the first semiconductor layer, and the first dielectric layer using the first hardmask layer as a mask (308). In an embodiment, the etching of the second dielectric layer may use a reactive ion etching (RIE) process. In another embodiment, the etching of the first semiconductor layer may use a Deep RIE (DRIE) process, which may provide a highly anisotropic etch and produce steep-sided etching recesses. In one embodiment, the etching of the first dielectric layer may use an RIE process.

Method 300 may further include etching the second semiconductor layer using the first hardmask layer as a mask to form a plurality of recesses each with a tapered surface (310). After the etching process is completed, the method may further include removing the first hardmask layer. Each of the plurality of the recesses comprises a first depth at a first region and a second depth greater than the first depth at a second region. In one embodiment, the first semiconductor layer is characterized by a (1 1 0) crystal orientation and the second semiconductor layer is characterized by a (1 1 1) crystal orientation. Etching the second semiconductor layer may use a potassium hydroxide (KOH) process that displays an etch rate selectivity 400 times higher for the (1 0 0) crystal orientation than the (1 1 1) crystal orientation. In another embodiment, the etching of the second semiconductor layer can utilize an ethylene diamine and pyrocatechol (EDP) process and a tetramethylammonium hydroxide (TMAH) process to etch the second semiconductor layer to form the tapered surface.

Method 300 may further include forming a protective dielectric layer coupled to the tapered surface of the plurality of recesses and to the second dielectric layer (312). In one embodiment, the protective dielectric layer may include Sift or resist material.

Method 300 may further include forming a second hardmask layer coupled to the third dielectric layer (314). The second hardmask layer can include a second set of openings exposing a second surface portion of the third dielectric layer. The second surface portion of the third dielectric layer can thus be aligned with at least part of each of the plurality of recesses.

Then, the method 300 may further include etching the third dielectric layer and the second semiconductor layer using the second hardmask layer as a mask and etching into the plurality of the recesses (316). Accordingly, the etched area may extend into the recesses since the opening in the hardmask is aligned with a portion of the recess. Thereafter, method 300 may include removing the second hardmask layer, the third dielectric layer, and the second dielectric layer (318).

It should be understood that the specific steps illustrated in FIG. 3 provide a particular method of fabricating a cantilever according to an embodiment of the present invention. Other sequences of steps may also be performed according to alternative embodiments. For example, alternative embodiments of the present invention may perform the steps outlined above in a different order. Moreover, the individual steps illustrated in FIG. 3 may include multiple sub-steps that may be performed in various sequences as appropriate to the individual steps. Furthermore, additional steps may be added or removed depending on a particular application. One of ordinary skill in the art would recognize many variations, modifications, and alternatives.

Figure 4:
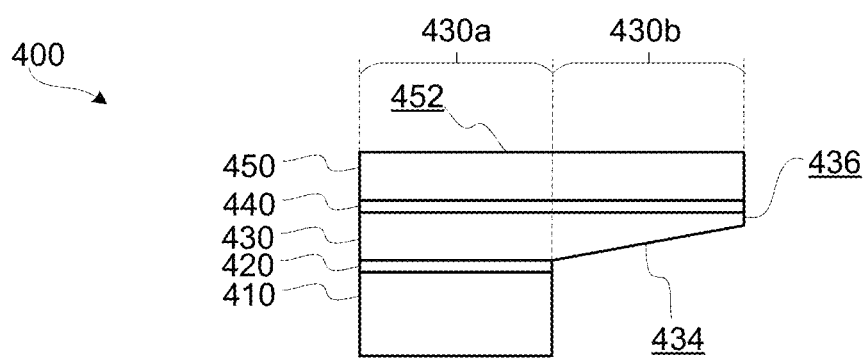
FIG. 4 is a simplified side view illustrating a cantilever according to an embodiment of the present invention.

FIG. 4 is a simplified side view illustrating a cantilever according to an embodiment of the present invention. Referring to FIG. 4, cantilever 400 may include first semiconductor layer 410, first dielectric layer 420 coupled to first semiconductor layer 410, second semiconductor layer 430 coupled to first dielectric layer 420, second dielectric layer 440 coupled to second semiconductor layer 430, and third dielectric layer 450 coupled to second dielectric layer 440. In one embodiment, cantilever 400 may be made using a semiconductor substrate, such as a silicon-on-silicon-on-insulator (SO-SOI) wafer. In this case, first semiconductor layer 410 may include silicon, and can have a thickness of about 400 μm. First dielectric layer 120 may be a buried oxide (BOX) layer including SiO$_2$ and can have a thickness of about 1 μm. Second semiconductor layer 130 may be a first device layer including silicon and can have a thickness of about 105 μm. Second dielectric layer 440 may be another BOX layer including SiO$_2$ and can have a thickness of 1 μm. Third dielectric layer 450 may be a second device layer including silicon and can have a thickness of 10 μm. Third dielectric layer 450 may include device surface 452, in which a MEMS device may be fabricated or to which a MEMS device may be attached. Second semiconductor layer 430, second dielectric layer 440, and third dielectric layer 450 are divided horizontally into base portion 430a and cantilever portion 430b. Cantilever portion 430b of second semiconductor layer 430 may include tapered surface 434 and end tip 436.

Figure 5A:
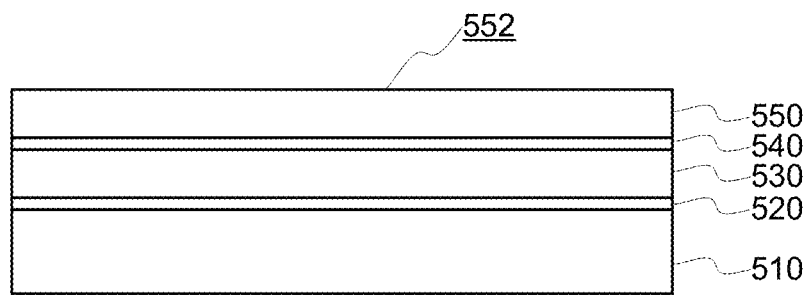
FIGS. 5A through 5K are partial cross-sectional views illustrating a method of fabricating a cantilever according to an embodiment of the present invention.

Referring to FIGS. 5A through 5K, a method of fabricating a cantilever 500 is described according to an embodiment of the present invention. FIG. 5A is a partial cross-sectional view illustrating a semiconductor substrate (e.g., an SO-SOI wafer) comprising first semiconductor layer 510, first dielectric layer 520 coupled to first semiconductor layer 510, second semiconductor layer 530 coupled to first dielectric layer 520, second dielectric layer 540 coupled to second semiconductor layer 530, and third dielectric layer 550 coupled to second dielectric layer 540. For clarity of description, the side where third dielectric layer 550 is disposed is designated as the first side of the semiconductor substrate, and the side where first semiconductor layer 510 is disposed is designated as second side of the semiconductor substrate. In one embodiment, first semiconductor layer 510 may include silicon having a thickness of about 400 μm. Second semiconductor layer 520 may be a BOX layer, such as a SiO$_2$ layer, and may have a thickness of about 1 μm. Second semiconductor layer 530 may be a first device layer including single crystal silicon and may have a thickness of about 105 μm. Second dielectric layer 540 may be another BOX layer, such as a SiO$_2$ layer, having a thickness of about 1 μm.

Third dielectric layer 550 may be a second device layer including single crystal silicon and may have a thickness of about 10 μm. It should be noted that the thicknesses of respective semiconductor layers, including first semiconductor layer 510, first dielectric layer 520, second semiconductor layer 530, second dielectric layer 540, and third dielectric layer 550, may vary as appropriate to the particular application. In one embodiment, first semiconductor layer 510 is characterized by a (1 0 0) or (1 1 0) crystal orientation, second semiconductor layer 530 is characterized by a (1 1 1) crystal orientation, and third dielectric layer 550 is characterized by a (1 0 0) crystal orientation. Third dielectric layer 550 may include device surface 552, in which MEMS devices may be fabricated or to which MEMS devices may be attached. As an example, a metal layer (e.g., chrome) can be deposited on device surface 552. Then a lift-off process may be performed to pattern the metal layer.

Figure 5B:
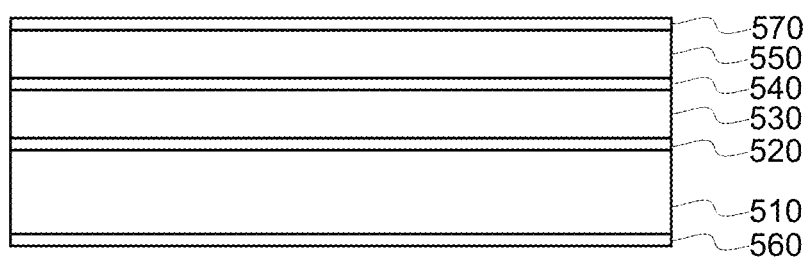

Referring to FIG. 5B, fourth dielectric layer 560 is formed on first semiconductor layer 510, and fifth dielectric layer 570 is formed on third dielectric layer 550. In one embodiment, fourth dielectric layer 560 and fifth dielectric layer 570 may include silicon nitride ($Si_3N_4$) having a thickness in a range of about 0.5-2 μm. In one embodiment, fourth dielectric layer 560 and fifth dielectric layer 570 may be formed using a LPCVD process. In some embodiments of the present invention, as described more fully below, a cantilever may be formed in which device surface 552 serves as a device layer of the cantilever. Thus, fifth dielectric layer 570 may protect device surface 552 during subsequent etching processes. In some embodiments, fourth dielectric layer 560 and/or fifth dielectric layer 570 may be not utilized as appropriate to the particular application.

Figure 5C:
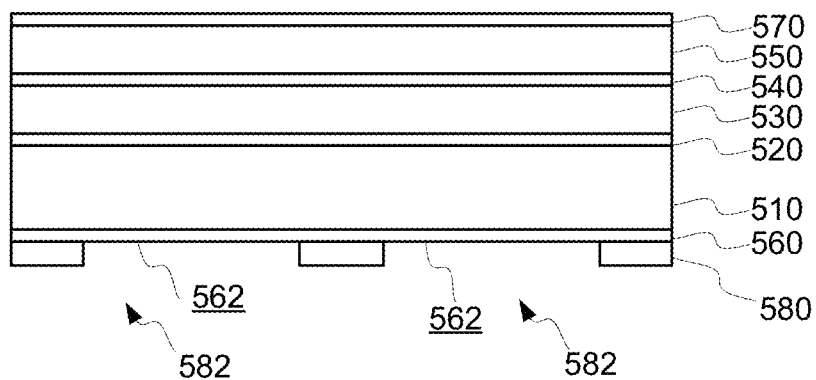

Referring to FIG. 5C, first hardmask layer 580 is formed on fourth dielectric layer 560. First hardmask layer 580 is patterned with first set of openings 582 through which first surface portion 562 of fourth dielectric layer 560 is exposed.

Figure 5D:
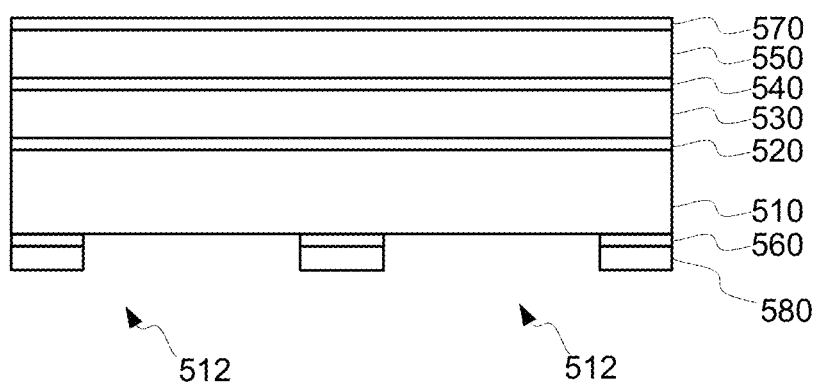
Figure 5E:
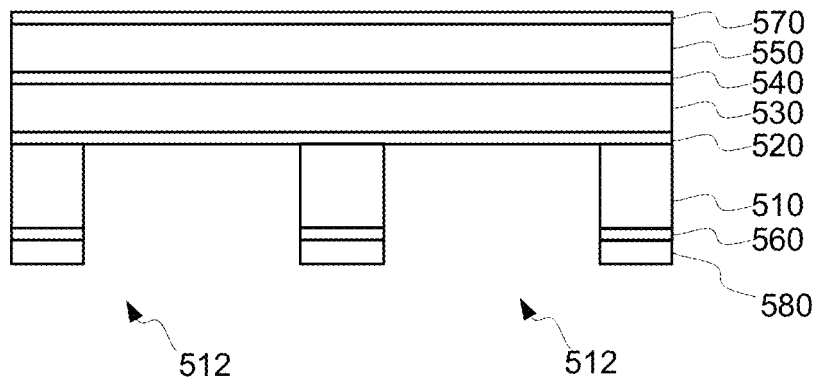
Figure 5F:
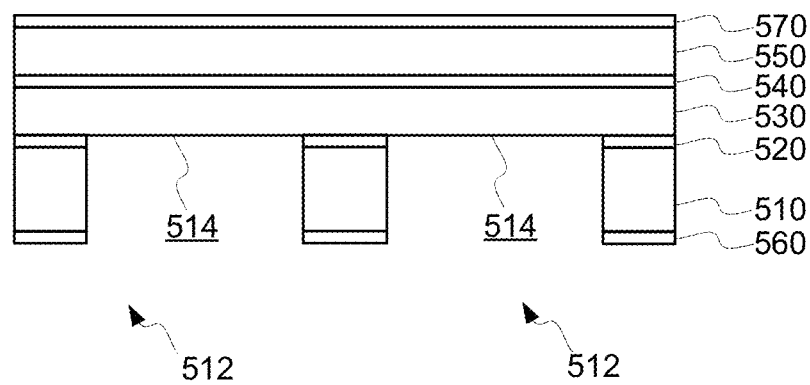

FIGS. 5D through 5F show the intermediate stages of etching a predetermined portion of the second side of the semiconductor substrate to form a plurality of recesses in the second side, wherein each of the plurality of recesses may include an etch termination surface. Referring to FIG. 5D, an etching process is performed on fourth dielectric layer 560 using first hardmask layer 580 as a mask to form a plurality of recesses 512. In one embodiment, the etching process may include an RIE process.

Referring to FIG. 5E, an etching process is performed on first semiconductor layer 510 using first hardmask layer 580 as a mask. In one embodiment, the etching process may include a DRIE process that extends recesses 512 through first semiconductor layer 510.

Referring to FIG. 5F, an etching process is performed on first dielectric layer 520 using first hardmask layer 580 as a mask. In one embodiment, the etching process may include an RIE process that forms recesses 512 passing through first dielectric layer 520 and form etch termination surface 514. Thereafter, first hardmask layer 580 is removed.

Figure 5G:
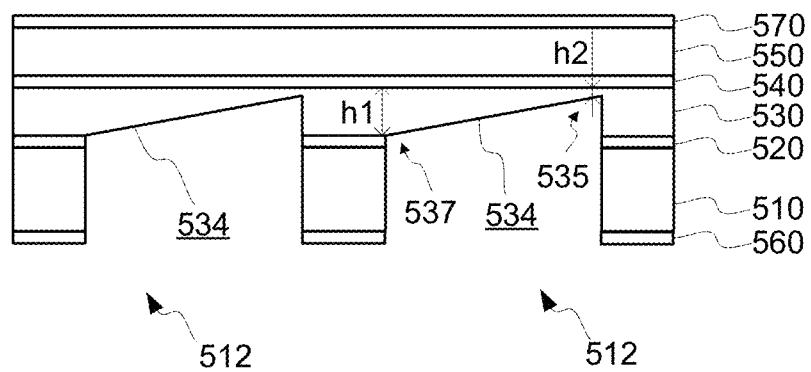

Referring to FIG. 5G, an etching process is performed on second semiconductor layer 530 to form tapered surface 534 within each of recesses 512. In one embodiment, first semiconductor layer 510 is characterized by a (1 1 0) crystal orientation, and second semiconductor layer 530 is characterized by a (1 1 1) crystal orientation. The etching process may include a KOH-based etch process, a EDP process or a TMAH process. In one embodiment, the etching process is performed for a predetermined time period, such as 30 minutes. It should be noted that the time period may vary as appropriate to the particular application according to the thickness of second semiconductor layer 530 and the particular etching process adopted. In each of recesses 512, tapered surface 534 progresses from base region 537 where the thickness h1 of second semiconductor layer 530 remains substantially unchanged to end region 535 where the thickness h2 of second semiconductor layer 530 is substantially reduced to a predetermined thickness, such as 10 μm.

Figure 5H:
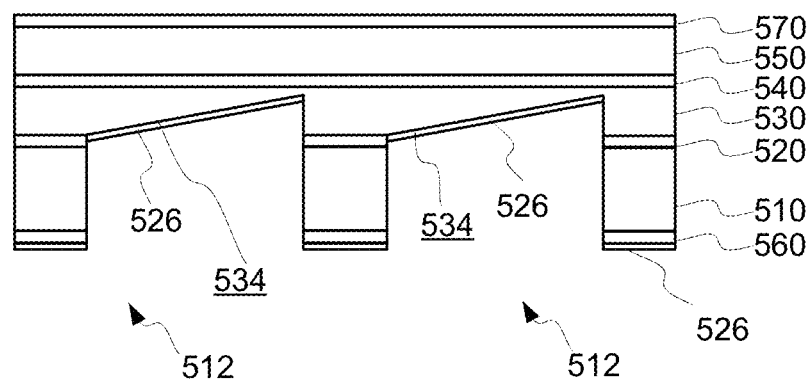

Referring to FIG. 5H, protective dielectric layer 526 is formed on tapered surface 534 and fourth dielectric layer 560. In one embodiment, protective dielectric layer 526 may include $SiO_2$ or photoresist layer having a thickness in a range of about 0.5-2 μm. In some embodiments of the present invention, protective dielectric layer 526 may protect tapered surface 534 from subsequent etching processes. In some other embodiments, the method may omit the process of forming protective dielectric layer 526 depending on the particular application.

Figure 5I:
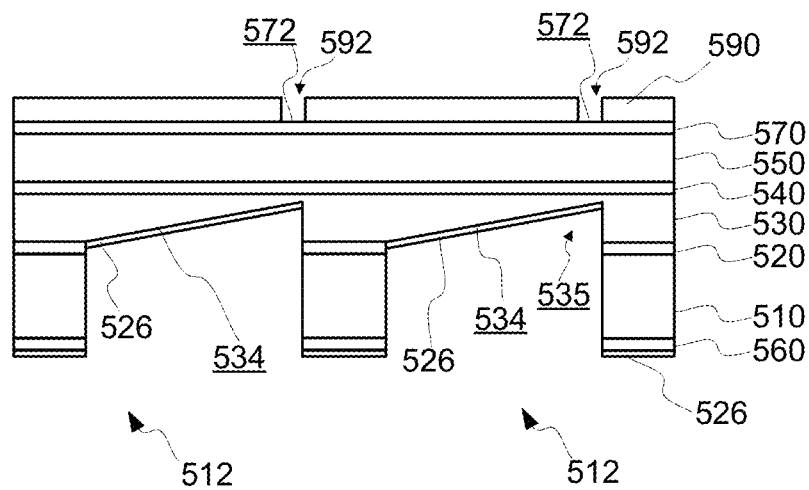
Figure 5J:
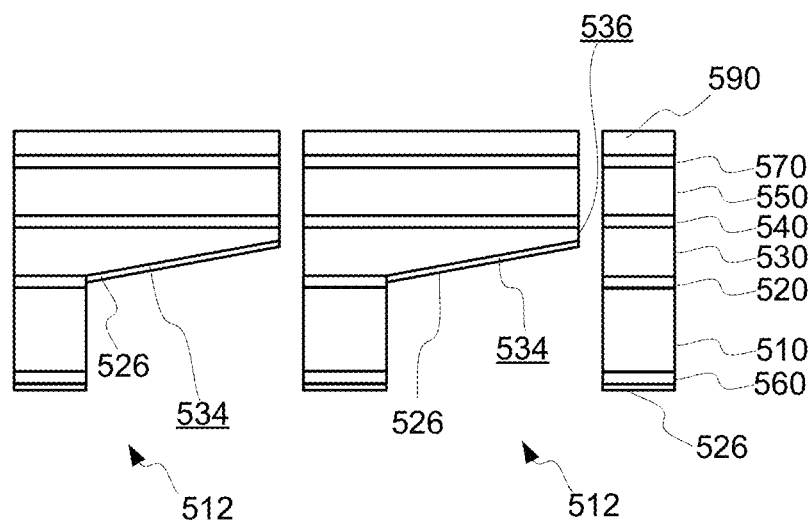

FIGS. 5I through 5J show the intermediate stages of etching a predetermined portion of the device surface of the semiconductor substrate to release end region 535 of the cantilever. Referring to FIG. 5I, second hardmask layer 590 is formed on fifth dielectric layer 570. In one embodiment, second hardmask layer 590 is patterned to define second set of openings 592 through which second surface portion 572 of fifth dielectric layer 570 is exposed. In one embodiment, second surface portion 572 is aligned with at least part of end region 535 of tapered surface 534 so as to enable the etching process (as defined by second set of openings 592) to separate end region 535 of the cantilever from the rest of second semiconductor layer 530. In one embodiment, the size of third set of openings 592 is determined to make the thickness h2 at end region 535 after separation to be a predetermined value, such as 10 μm.

Referring to FIG. 5J, an etching process is performed on fifth dielectric layer 570 using second hardmask layer 590 as a mask. In one embodiment, the etching process may include an RIE process. Then, an additional etching process is performed on third dielectric layer 550, second dielectric layer 540, and second semiconductor layer 530 using second hardmask layer 590 as a mask. In one embodiment, the additional etching process may include a BOE process. After the additional etching process, end tip 536 is formed at end region 535. In one embodiment, the thickness of end tip 536 may be 10 μm.

Figure 5K:
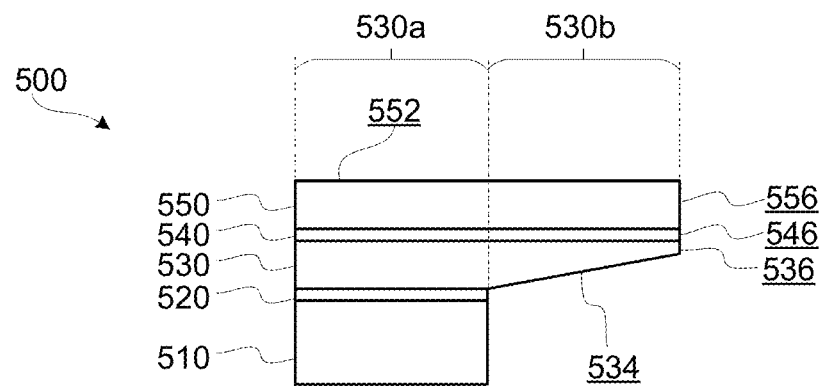

Referring to FIG. 5K, second hardmask layer 590, fifth dielectric layer 570, protective dielectric layer 526, and fourth dielectric layer 560 are removed. As shown in FIG. 5K, cantilever 500 is divided into base portion 530a and cantilever portion 530b. In one embodiment, first semiconductor layer 510 and first dielectric layer 520 may include only base portion 530a, while second semiconductor layer 530, second dielectric layer 540, and third dielectric layer 550 may include both base portion 530a and cantilever portion 530b. In one embodiment, cantilever portion 530b of second semiconductor layer 530 include tapered surface 534 and end tip 536, cantilever portion 530b of second dielectric layer 540 includes end surface 546, and cantilever portion 530b of third dielectric layer 550 includes end surface 556. In some embodiments, end tip 536, end surface 546, and end surface 556 may be configured in combination to function as the light emitting tip of a scanning fiber display device. In some other embodiments, it is possible that only end tip 536 is used as light emitting tip of a scanning fiber display device.

Figure 5L:
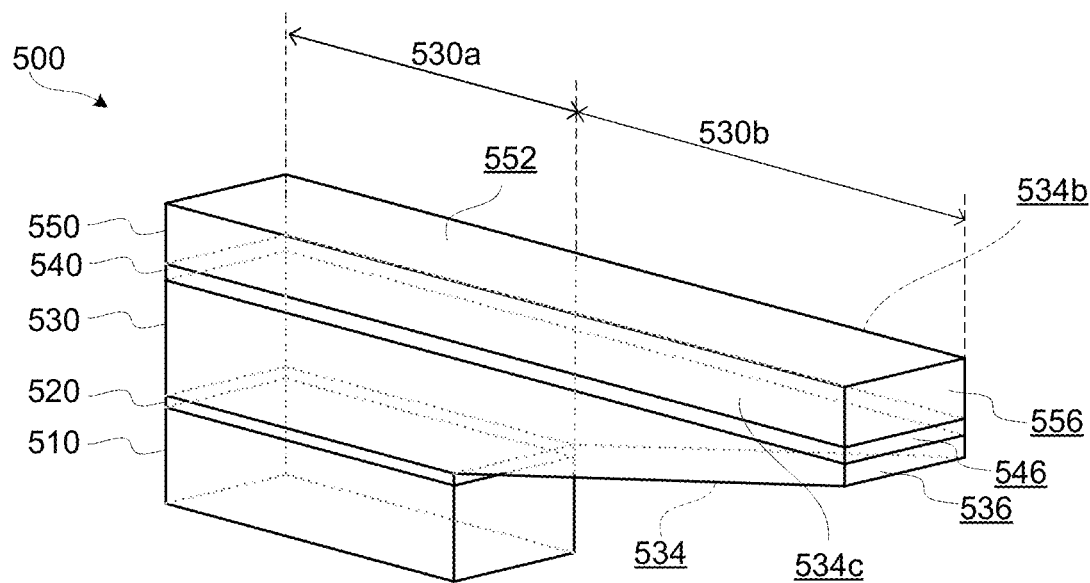
FIG. 5L is a perspective view illustrating a cantilever according to an embodiment of the present invention.

FIG. 5L is a perspective view illustrating cantilever 500 according to an embodiment of the present invention. Referring to FIG. 5L, cantilever 500 may include first semiconductor layer 510, first dielectric layer 520, second semiconductor layer 530, second dielectric layer 540, and third dielectric layer 550. Second semiconductor layer 530 includes tapered surface 534 and end tip 536. Second dielectric layer 540 includes end surface 546. Third dielectric layer 550 includes device surface 552 and end surface 556. In addition, second semiconductor layer 530, second dielectric layer 540, and third dielectric layer 550 may include lateral surfaces 534b and 534c that are parallel with each other as described below.

Figure 5M:
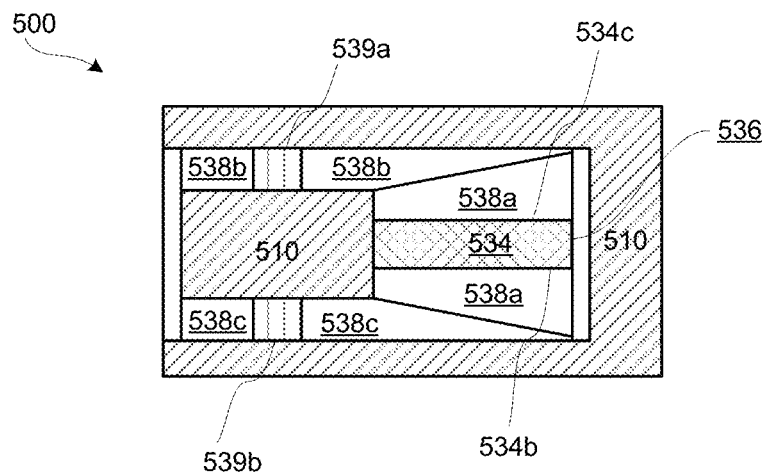
FIG. 5M is a partial bottom view of the cantilever as shown in FIG. 5K.

FIG. 5M is a partial bottom view of cantilever 500 as shown in FIG. 5K. Referring to FIG. 5M, tapered structures defined by tapered surface 538a, 538b and 538c are formed within second semiconductor layer 530 as the result of the KOH etching process described with reference to FIG. 5G. The hatched rectangle labeled by tapered surface 534 denotes the length and width of cantilever portion 530b as shown in FIG. 5L. In one embodiment, additional anisotropic etching process, such as a DRIE process, may be performed to remove portions of second semiconductor layer 530, second dielectric layer 540, and third dielectric layer 550 denoted by tapered surface 538a, 538b, and 538c, and form lateral surfaces 534b and 534c perpendicular to the first side of the semiconductor substrate. In one embodiment, lateral surfaces 534b and 534c are parallel with each other. In one embodiment, passages 539a and 539b may be formed using etching processes, such as a DRIE process to provide pathways among first semiconductor layer 510, second semiconductor layer 530, and third dielectric layer 550.

Figure 5N:
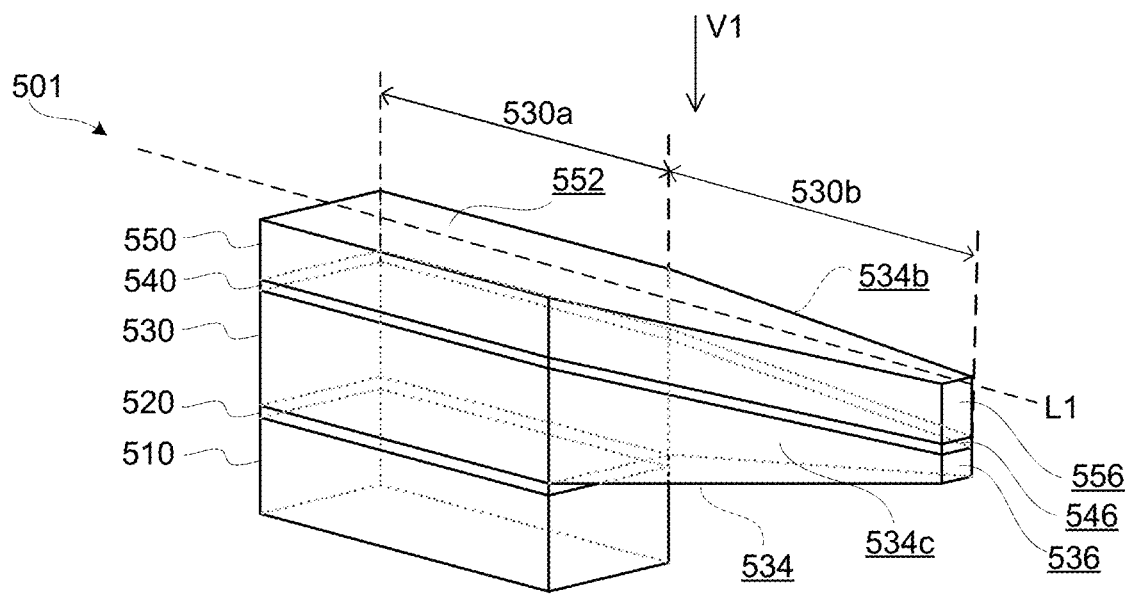
FIG. 5N is a perspective view illustrating another cantilever according to an embodiment of the present invention.

FIG. 5N is a perspective view illustrating another cantilever 501 according to another embodiment of the present invention. Referring to FIG. 5N, cantilever 501 includes first semiconductor layer 510, first dielectric layer 520, second semiconductor layer 530, second dielectric layer 540, and third dielectric layer 550. Second semiconductor layer 530 includes tapered surface 534 and end tip 536. Second dielectric layer 540 includes end surface 546, and third dielectric layer 550 includes end surface 556. Second semiconductor layer 530, second dielectric layer 540, and third dielectric layer 550 include lateral tapered surfaces 534b and 534c at cantilever portion 530b. Cantilever 501 with triple tapered surfaces 534, 534b, and 534c may provide the flexibility to adjust the size of end tip 536, end surface 546, and end surface 556. As discussed below, the positioning of end tip 536, end surface 546, and end surface 556 about longitudinal axis L1 can be adjusted by controlling the tapering of lateral tapered surface 534b and 534c.

Figure 5O:
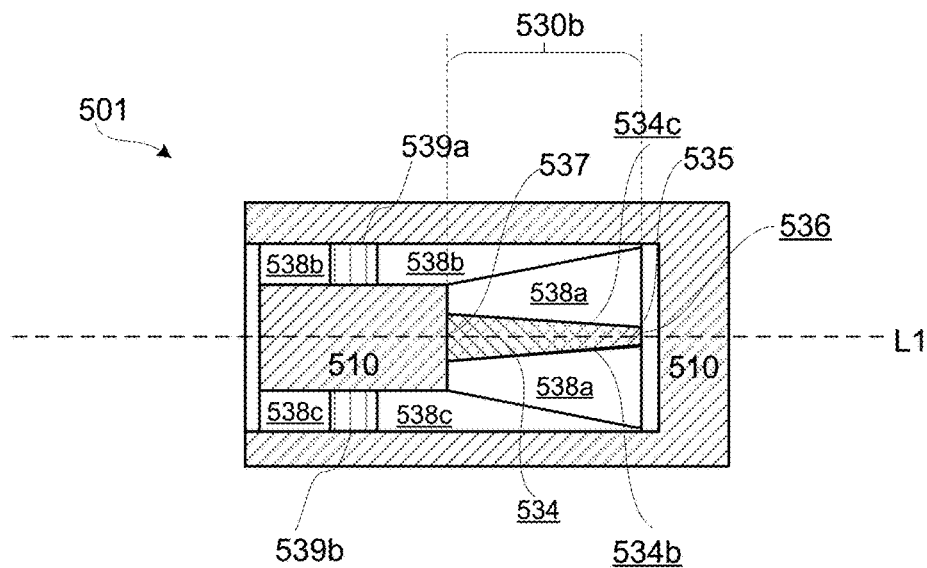
FIG. 5O is a partial bottom view illustrating a cantilever according to another embodiment of the present invention.

FIG. 5O is a partial bottom view illustrating cantilever 501 according to another embodiment of the present invention. The difference of cantilever 501 shown in FIG. 5O from that shown in FIG. 5M lies in the triple tapered surfaces provided for cantilever portion 530b (shown in FIG. 5N). Referring to FIG. 5O, when etching portions of second semiconductor layer 530, second dielectric layer 540, and third dielectric layer 550 denoted by tapered surface 538a, the width of cantilever portion 530b is tapered from base region 537 to end region 535 to form two lateral tapered surfaces 534b and 534c. In one embodiment, the tapering of tapered surface 534b and 534c is symmetrical about longitude axis L1 of cantilever 501. In another embodiment, the tapering of tapered surfaces 534b and 534c may be asymmetrical about longitude axis L1. For example, the tapering of tapered surface 534b may be more rapid than that of tapered surface 534c. In another embodiment, the tapering of tapered surface 534b may be slower than that of tapered surface 534c. The tapering of tapered surface 534b and 534c may vary as appropriate to the particular application.

Figure 5P:
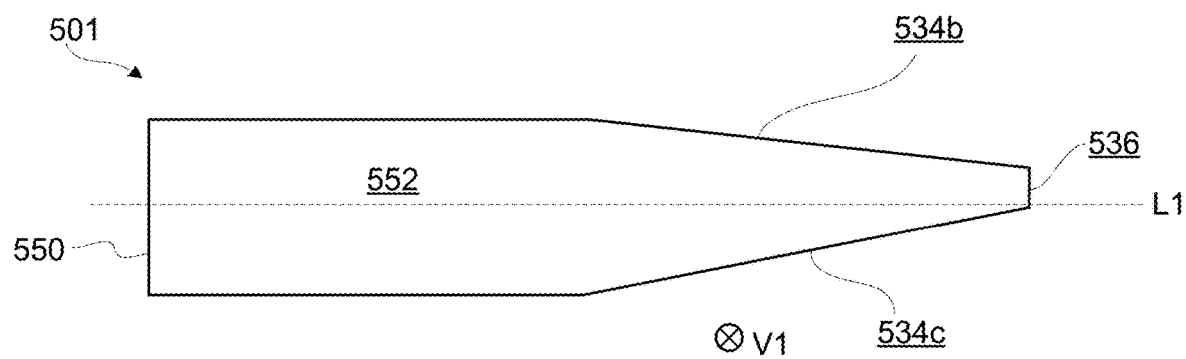
FIGS. 5P and 5Q are simplified top views illustrating a cantilever according to an embodiment of the present invention.
Figure 5Q:
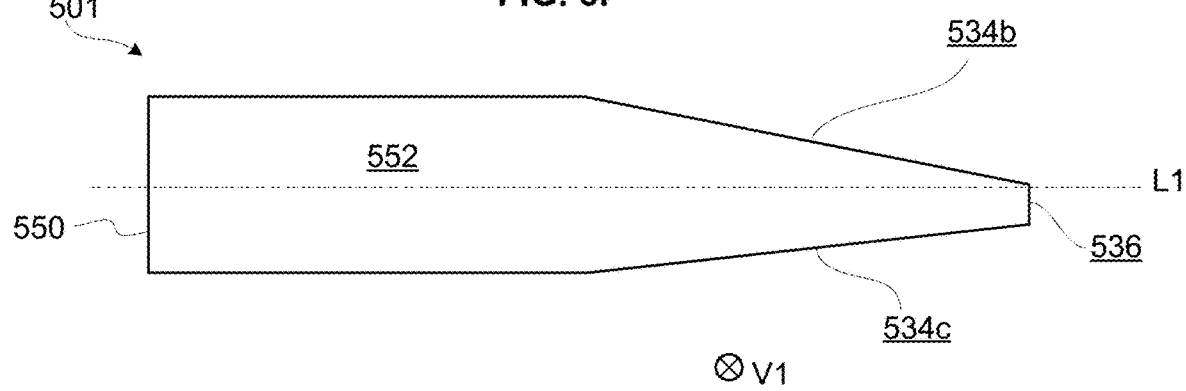

FIGS. 5P and 5Q are simplified top views illustrating cantilever 501 according to an embodiment of the present invention. Referring to FIG. 5P, the tapering of lateral tapered surface 534c is more rapid than that of lateral tapered surface 534b. As a result, end tip 536, end surface 546 (not shown) and end surface 556 (not shown) are positioned in a manner such that the center of the end tip is disposed to the left of longitudinal axis L1. Thus, when viewing end tip 536 along direction V1 normal to device surface 552 and perpendicular to longitudinal axis L1 as shown in FIG. 5N, end tip 536, end surface 546, and end surface 556 may offset to the left of longitudinal axis L1 in FIG. 5N. Referring to FIG. 5Q, the tapering of lateral tapered surface 534c is slower than that of lateral tapered surface 534b. Thus, when viewing end tip 536 along direction V1 normal to device surface 552 and perpendicular longitudinal axis L1 as shown in FIG. 5N, end tip 536, end surface 546, and end surface 556 may offset to the right of longitudinal axis L1 in FIG. 5N.

Numerous benefits may be provided by the flexibility of adjusting end tip 536, end surface 546, and end surface 556 by controlling the triple tapered surfaces 534, 534b, and 534c, alone or in combination. For example, cantilever 501 with differently configured end tip 536, end surface 546, and end surface 556 may be used to accommodate different optical structures of scanning fiber display devices.

Figure 6:
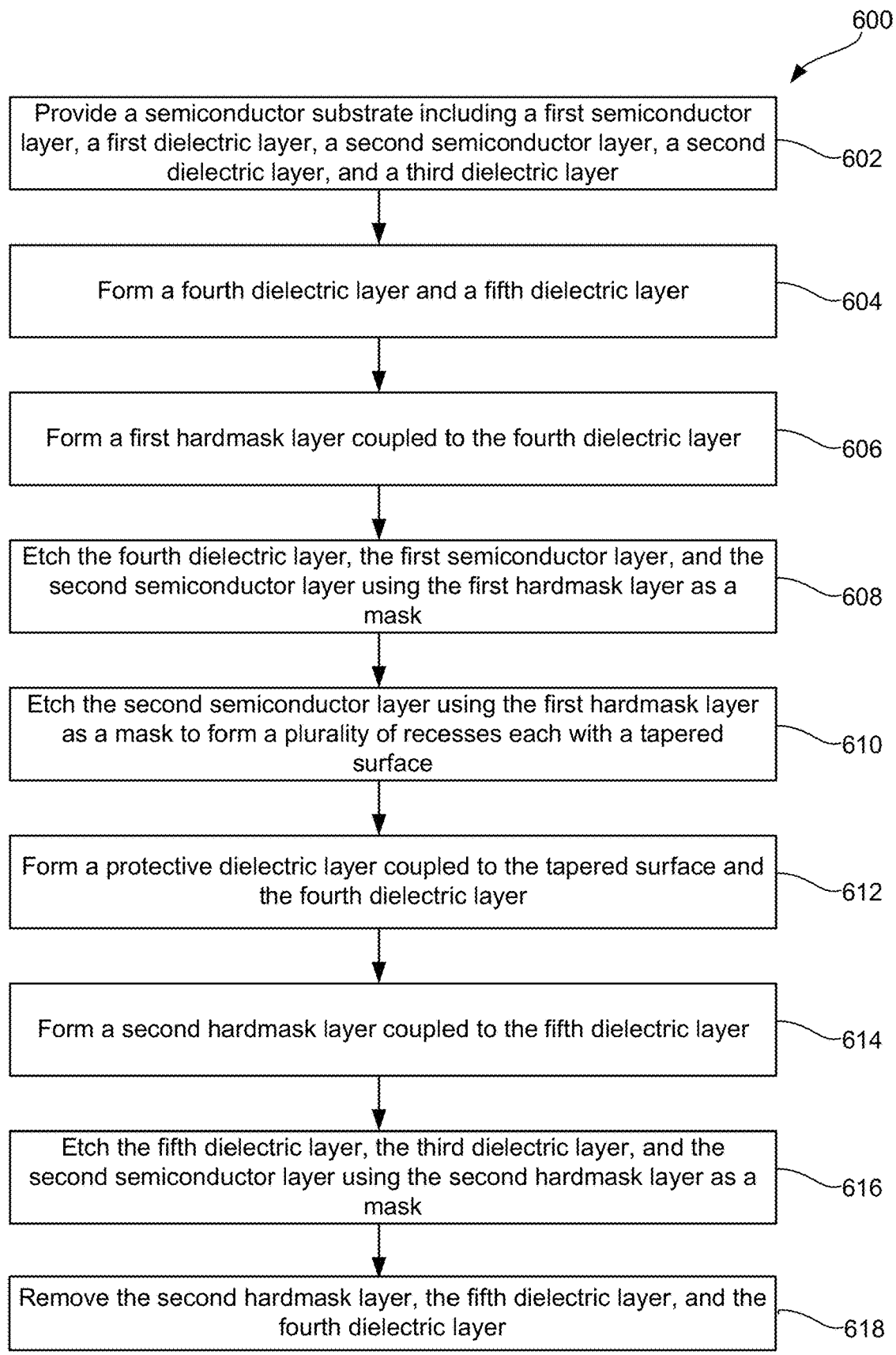
FIG. 6 is a simplified flowchart illustrating a method of fabricating a cantilever according to an embodiment of the present invention.

FIG. 6 is a simplified flowchart illustrating method 600 of fabricating a cantilever according to an embodiment of the present invention. Referring to FIG. 6, method 600 includes providing a semiconductor substrate including a first semiconductor layer, a first dielectric layer, a second semiconductor layer, a second dielectric layer, and a third dielectric layer (602). In the illustrated embodiment, the semiconductor substrate may include an SO-SOI substrate, comprising a first semiconductor layer (e.g., Si), a first dielectric layer (e.g., $SiO_2$) coupled to the first semiconductor layer, a second semiconductor layer (e.g., Si) coupled to the first dielectric layer, a second dielectric layer (e.g., $SiO_2$) coupled to the second semiconductor layer, and a third dielectric layer (e.g., Si) coupled to the second dielectric layer. In one embodiment, the first semiconductor layer may include a Si layer having a thickness of about 400 μm, the first dielectric layer may include a $SiO_2$ layer having a thickness of about 1 μm, the second semiconductor layer may include a Si layer having a thickness of about 105 μm, the second dielectric layer may include a $SiO_2$ layer having a thickness of about 1 μm, and the third dielectric layer may include a Si layer having a thickness of about 10 μm.

Method 600 may further include forming a fourth dielectric layer coupled to the first semiconductor layer; and forming a fifth dielectric layer coupled to the third dielectric layer (604). In one embodiment, the fourth dielectric layer and the fifth dielectric layer may include $Si_3N_4$ to protect the lower surface and the upper surface of the semiconductor substrate during subsequent etching processes. In some embodiments, method 600 can omit the process of forming the fourth dielectric layer.

Method 600 may further include forming a first hardmask layer coupled to the fourth dielectric layer (606). The first hardmask layer can include a first set of openings exposing a first surface portion of the fourth dielectric layer.

Method 600 may further include etching the fourth dielectric layer, the first semiconductor layer, and the first dielectric layer using the first hardmask layer as a mask (608). In an embodiment, the etching of the fourth dielectric layer may use an RIE process. In another embodiment, the etching of the first semiconductor layer may use a DRIE process. In one embodiment, the etching of the first dielectric layer may use an RIE process.

Method 600 may further include etching the second semiconductor layer using the first hardmask layer as a mask to form a plurality of recesses each with a tapered surface (610). Each of the plurality of the recesses may include a first depth at a first region and a second depth greater than the first depth at a second region. After the etching process is completed, the method may further include removing the first hardmask layer. In one embodiment, the first semiconductor layer is characterized by a (1 1 0) crystal orientation and the second semiconductor layer is characterized by a (1 1 1) crystal orientation. Etching the second semiconductor layer may use a KOH-based process. In another embodiment, etching of the second semiconductor layer may utilize an EDP process and a TMAH process to etch the second semiconductor layer to form the tapered surface.

Method 600 may further include forming a protective dielectric layer coupled to the tapered surface of the plurality of recesses and to the fourth dielectric layer (612). In one embodiment, the protective dielectric layer may include Sift or resist material.

Method 600 may further include forming a second hardmask layer coupled to the fifth dielectric layer (614). The second hardmask layer can include a second set of openings exposing a second surface portion of the fifth dielectric layer. The second surface portion of the fifth dielectric layer can thus be aligned with at least part of the second region of each of the plurality of recesses.

Then, the method may further include etching the fifth dielectric layer, the third dielectric layer, and the second semiconductor layer using the second hardmask layer as a mask and etching into the plurality of the recesses (616). Thereafter, the method may include removing the second hardmask layer, the fifth dielectric layer, and the fourth dielectric layer (618).

It should be understood that the specific steps illustrated in FIG. 6 provide a particular method of fabricating a cantilever according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual steps. Furthermore, additional steps may be added or removed depending on a particular application. One of ordinary skill in the art would recognize many variations, modifications, and alternatives.

Embodiments of the present invention are described herein with reference to the accompanying drawings. The invention may, however, be embodied in many different forms and should not be construed as limited to the embodiments set forth herein. Rather, these embodiments are provided so that this invention will be thorough and complete, and will fully convey the scope of the invention to those skilled in the art. The features may not be drawn to scale, some details may be exaggerated relative to other elements for clarity. Like numbers refer to like elements throughout.

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention.

Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

It is to be understood that the appended claims are not limited to the precise configuration illustrated in the drawings. One of ordinary skill in the art would recognize various modification, alternatives, and variations may be made in the arrangement and steps of the methods and devices above without departing from the scope of the invention.

What is claimed is:

1. A method for fabricating a cantilever, the method comprising:
   providing a semiconductor substrate comprising a first semiconductor layer, a first dielectric layer coupled to the first semiconductor layer, and a second semiconductor layer coupled to the first dielectric layer;
   forming a second dielectric layer coupled to the first semiconductor layer;
   forming a third dielectric layer coupled to the second semiconductor layer;
   forming a first hardmask layer coupled to the second dielectric layer, wherein the first hardmask layer comprises a first set of openings exposing a first surface portion of the second dielectric layer;
   etching the second dielectric layer using the first hardmask layer as a mask;
   etching the first semiconductor layer using the first hardmask layer as a mask;
   etching the first dielectric layer using the first hardmask layer as a mask;
   etching the second semiconductor layer using the first hardmask layer as a mask to form a plurality of recesses each with a tapered surface, wherein each of the plurality of the recesses comprises a first depth at a first region and a second depth greater than the first depth at a second region;
removing the first hardmask layer;
forming a second hardmask layer coupled to the third dielectric layer, wherein the second hardmask layer comprises a second set of openings exposing a second surface portion of the third dielectric layer, wherein the second surface portion of the third dielectric layer is aligned with at least part of the second region of each of the plurality of recesses;
etching the third dielectric layer and the second semiconductor layer using the second hardmask layer as a mask to extend into the plurality of the recesses;
removing the second hardmask layer;
removing the third dielectric layer; and
removing the second dielectric layer.

2. The method of claim 1 further comprising forming a chrome layer coupled to the second semiconductor layer.

3. The method of claim 1 wherein etching the first semiconductor layer comprises using a Deep RIE (DRIE) process.

4. The method of claim 1 wherein the first semiconductor layer is characterized by a (1 1 0) crystal orientation.

5. The method of claim 1 wherein the second semiconductor layer is characterized by a (1 1 1) crystal orientation.

6. The method of claim 1 wherein etching the second semiconductor layer comprises using a potassium hydroxide (KOH) process for a predetermined time period.

7. The method of claim 1 further comprising forming a protective dielectric layer coupled to the tapered surface of the plurality of recesses and to the second dielectric layer.

8. The method of claim 7 wherein forming the protective dielectric layer is performed after etching the second semiconductor layer.

9. A method for fabricating a cantilever having a device surface, a tapered surface, and an end region, the method comprising:
providing a semiconductor substrate having a first side and a second side opposite to the first side;
etching a predetermined portion of the second side to form a plurality of recesses in the second side, wherein each of the plurality of recesses comprises an etch termination surface;
anisotropically etching the etch termination surface to form the tapered surface of the cantilever; and
etching a predetermined portion of the device surface to release the end region of the cantilever.

10. The method of claim 9 further comprising anisotropically etching the tapered surface of the cantilever to form a first lateral tapered surface perpendicular to the first side of the semiconductor substrate, wherein the first lateral tapered surface tapers along the tapering direction of the tapered surface of the cantilever.

11. The method of claim 10 further comprising anisotropically etching the tapered surface of the cantilever to form a second lateral tapered surface perpendicular to the first side of the semiconductor substrate, wherein the second lateral tapered surface is formed opposite to the first lateral tapered surface, and wherein the second lateral tapered surface tapers along the tapering direction of the tapered surface of the cantilever.

12. The method of claim 11 wherein the tapering of the first lateral tapered surface is more rapid than the tapering of the second lateral tapered surface.

13. The method of claim 11 wherein the tapering of the first lateral tapered surface is slower than the tapering of the second lateral tapered surface.

14. The method of claim 11 wherein the tapering of the first lateral tapered surface is identical to the tapering of the second lateral tapered surface.

15. The method of claim 9 wherein anisotropically etching the etch termination surface comprises using a potassium hydroxide (KOH), ethylene diamine and pyrocatechol (EDP), or tetramethylammonium hydroxide (TMAH) process.

16. The method of claim 9 wherein the semiconductor substrate includes a first semiconductor layer characterized by a (1 1 0) crystal orientation and a second semiconductor layer characterized by a (1 1 1) crystal orientation.

17. A method for fabricating a semiconductor cantilever, the method comprising:
providing a semiconductor substrate, wherein the semiconductor substrate comprises a first semiconductor layer, a first dielectric layer coupled to the first semiconductor layer, a second semiconductor layer coupled to the first dielectric layer, a second dielectric layer coupled to the second semiconductor layer, and a third dielectric layer coupled to the second dielectric layer;
forming a fourth dielectric layer coupled to the first semiconductor layer;
forming a fifth dielectric layer coupled to the third dielectric layer;
forming a first hardmask layer coupled to the fourth dielectric layer, wherein the first hardmask layer comprises a first set of openings exposing a first surface portion of the fourth dielectric layer;
etching the fourth dielectric layer using the first hardmask layer as a mask;
etching the first semiconductor layer using the first hardmask layer as a mask;
etching the first dielectric layer using the first hardmask layer as a mask;
etching the second semiconductor layer using the first hardmask layer as a mask to form a plurality of recesses each with a tapered surface, wherein each of the plurality of the recesses comprises a first depth at a first region and a second depth greater than the first depth at a second region;
forming a second hardmask layer coupled to the fifth dielectric layer, wherein the second hardmask layer comprises a second set of openings exposing a second surface portion of the fifth dielectric layer, wherein the second surface portion of the fifth dielectric layer is aligned with at least part of the second region of the tapered surface;
etching the fifth dielectric layer, the third dielectric layer and the second semiconductor layer using the second hardmask layer as a mask to extend into the plurality of the recesses;
removing the second hardmask layer;
removing the fifth dielectric layer; and
removing the fourth dielectric layer.

18. The method of claim 17, further comprising forming a chrome layer coupled to the third dielectric layer.

19. The method of claim 17 wherein the first semiconductor layer is characterized by a (1 1 0) crystal orientation, and the second semiconductor layer is characterized by a (1 1 1) crystal orientation.

20. The method of claim 17 wherein etching the second semiconductor layer comprises using a potassium hydroxide (KOH) process for a predetermined time period.

\* \* \* \* \*